(12) United States Patent
Surulivel et al.

(10) Patent No.: US 8,321,726 B2
(45) Date of Patent: Nov. 27, 2012

(54) REPAIRING MEMORY ARRAYS

(75) Inventors: Murugeswaran Surulivel, Theni District (IN); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 1166 days.

(21) Appl. No.: 12/213,383

(22) Filed: Jun. 18, 2008

(65) Prior Publication Data

US 2009/0319839 A1    Dec. 24, 2009

(51) Int. Cl.
*G11C 29/00*    (2006.01)

(52) U.S. Cl. .................................. 714/711; 714/723

(58) Field of Classification Search .............. 714/710, 714/711
See application file for complete search history.

(56) References Cited

U.S. PATENT DOCUMENTS

| | | | | |
|---|---|---|---|---|
| 5,577,050 A | * | 11/1996 | Bair et al. ................ | 714/710 |
| 6,724,669 B1 | * | 4/2004 | Bhatia ..................... | 365/200 |
| 6,862,704 B1 | * | 3/2005 | Miner ..................... | 714/718 |
| 6,993,696 B1 | * | 1/2006 | Tanizaki et al. .......... | 714/744 |
| 7,734,966 B1 | * | 6/2010 | Lee et al. ................ | 714/718 |
| 2004/0133826 A1 | * | 7/2004 | Zhu et al. ................ | 714/711 |
| 2005/0028054 A1 | * | 2/2005 | Roohparvar ............. | 714/710 |

OTHER PUBLICATIONS

T. Kawagoe et al, "A Built-In Self-Repair Analyzer (CRESTA) for embedded DRAMs" ITC International Test Conference Paper 21.3, 2000, pp. 567-574.

* cited by examiner

*Primary Examiner* — John Trimmings
*Assistant Examiner* — Daniel McMahon
(74) *Attorney, Agent, or Firm* — Nixon & Vanderhye P.C.

(57) ABSTRACT

A memory array comprises a plurality of rows and a plurality of columns, each row comprising at least one addressable word. The memory array comprises at least one redundant row and at least one redundant column. Error detection circuitry analyzes the memory array by addressing words and detecting errors within the addressed words. Error repair circuitry selects for a detected error either a redundant row or a redundant column to replace one of the row or column containing the error. It is determined for the detected error whether the error is a single error bit in the addressed word or whether it is one of a plurality of error bits within the word. If the error is the latter, then the error repair circuitry preferentially selects a redundant row rather than a redundant column to repair the error.

12 Claims, 11 Drawing Sheets

REPAIRING MEMORY ARRAYS

TECHNICAL FIELD

The technical field relates to data processing and in particular to storage of data in memory arrays.

BACKGROUND

In the field of data storage microelectronic storage devices such as memories are being designed to store increasing amounts of data in ever smaller devices. This has led to faults within the devices becoming more common. Memories such as SRAM memories are therefore now being designed with some redundancy. This redundancy may be in the form of additional redundant rows and/or columns in each array. During testing of the array, errors can be detected and the redundant rows and/or columns can be used to replace the rows and/or columns having the errors within them. This means that the memories are repairable and provides a way of dealing with the increasing number of errors in such devices.

As each storage element within such an array is located within both a column and a row, the repair of a faulty element can be done using either a redundant row or column. Depending on the arrangement of other faulty locations in the memory it may be more efficient to repair an error with either a redundant row or a column. In order to correct the most number of errors present using the redundant rows and columns that are available various schemes for analysing the array have been devised. In one scheme a map of the whole array is made and a covering algorithm is then generated to arrange the redundant rows and columns to cover the maximum number of errors possible. This provides the best solution but is expensive in area to perform.

A simpler scheme for determining the best way of using the available redundant row and columns to cover the highest number of errors is described in "A Built-In Self-Repair Analyzer (CRESTA) for Embedded DRAMs" by Kawagoe et al, ITC International Test Conference 2000 pages 567-574. In this paper an array having two redundant rows and two redundant columns is considered, and the best repair solution is found deterministically by trying the spare rows and columns in different orders in real time RRCC, RCRC, RCCR, CRRC, CRCR, CCRR and finding the solution which covers most or all of the errors. This solution is then used to repair the memory.

A drawback of the "CRESTA" scheme is that the area required to provide the logic to implement the scheme is still considerable. Furthermore, with two redundant rows and columns the number of potential solutions is only six, however with an increasing number of redundant rows and columns this will increase dramatically. An increase in the potential number of solutions will make the "CRESTA" scheme more and more expensive in area.

SUMMARY

A first aspect provides a memory array comprising a plurality of rows and a plurality of columns, each row comprising at least one addressable word, said memory array comprising at least one redundant row and at least one redundant column; error detection circuitry for analysing said memory array, by addressing words within said memory array and detecting errors within said addressed words; error repair circuitry for selecting for a detected error either a redundant row or a redundant column to replace one of said row or column containing said error; wherein said error repair circuitry is configured to determine for said detected error whether said error is a single error bit in said addressed word or whether it is one of a plurality of error bits within said word, and if said error is said one of said plurality of errors, said error repair circuitry is configured to preferentially select a redundant row rather than a redundant column to repair said error.

The inventors recognized that a simple analysis of the word being addressed may provide a very good indication as to whether a row or column would be the preferred repair option for that error. Two errors within the word would indicate that a row would be a good option as it would repair both errors using a single redundant resource, while if there is only one error then this may not be the preferred solution. The technology described uses the fact that as the conventional access scheme to a memory involves addressing a word that lies in a row, then it is a simple matter to analyse that word to discover if it has one or multiple errors in it. If multiple errors are discovered, then repairing these errors with a row replacement results in all of the multiple errors within that word being repaired by this single replacement. Thus, this simple analysis can provide, in some cases, a dramatic improvement in allocation of repair resource and leads to a repair solution that is inexpensive in area but still very successful. It is not necessarily the best solution but it is a good solution that can be provided with few additional resources.

In some embodiments each row comprises a plurality of addressable words; and said error repair circuitry is adapted to group together at least some addressed words from a same row and to determine for an error detected within said same row whether said error comprises a single error within said grouped words or whether it comprises one of a plurality of errors within said grouped words, said error repair circuitry being configured to preferentially select a redundant row rather than a redundant column to repair said error if said error is one of said plurality of errors, and if said error is said single error said error repair circuitry is configured to preferentially select a redundant column to repair said error.

A simple case is to analyse an addressed word, however, the scheme can be improved further, without much additional logic by analysing several of the words in a row. As rows are repaired as a complete entity by replacing them with a redundant row then clearly it is advantgeous when determining the preferable repair scheme to analyse more than one of the words in a row to determine if the error is a single error or one of multiple errors in that row. If it is a single error then the preferred repair scheme may be to use a redundant column while if there are multiple errors a redundant row is preferable.

In some embodiments said error repair circuitry is configured to group together all words from a same row.

Analysing all the words in the row provides a good scheme for discovering multiple errors in a single row and this information can be used to decide if a redundant row is the preferred repair mechanism.

In some embodiments, in response to detecting that said detected error is a single error bit in said addressed word, said error repair circuitry is configured to preferentially select a redundant column rather than a redundant row to repair said error.

Generally if the error is a single error then the preferred solution is a redundant column rather than a row. The analysis of rows to find if there are multiple errors within them is straightforward given the way that memories are addressed, thus, it is this that is analysed and thus, if there is only a single error in the row a column can be used to repair it, which leaves the redundant rows to be used to repair multiple errors where possible. Clearly if there are no spare redundant columns then a redundant row could be used.

In some embodiments, said error repair circuitry is responsive to detecting no available redundant row or column corresponding to said preferential selection, to select an alternative available redundant column or row instead of said preferential selection to repair said error, and in response to detecting no available redundant rows or columns to issue a repair failed signal.

Where no redundant row or column is detected then the fault cannot be repaired and a repair fail signal is issued.

In some embodiments, said error detection circuitry is configured to analyse said memory by addressing said words within said memory array in at least one predetermined order.

The location of the errors can be detected by addressing the words in the memory array in one or more predetermined orders. The order of addressing can be selected so that the location of the errors are found efficiently. The order used will depend upon how data words are stored in the array and thus, will vary between embodiments.

Although the memory array may only have one redundant row and column, in some embodiments said memory array comprises a plurality of redundant rows and columns.

A further aspect provides a method of repairing a memory array comprising at least one redundant row and at least one redundant column comprising the steps of: analysing said memory array, by addressing words within said memory array and detecting errors within said addressed words; selecting for a detected error either a redundant row or a redundant column to replace one of said row or column containing said error; wherein said step of selecting a redundant row or column comprises determining for said detected error whether said error is a single error in said addressed word or whether it is one of a plurality of errors within said word, and if said error is said one of said plurality of errors preferentially selecting a redundant row rather than a redundant column to repair said error.

A yet further aspect provides a means for storing data comprising a plurality of rows and a plurality of columns, each row comprising at least one addressable word, said means for storing data comprising at least one redundant row and at least one redundant column; error detecting means for analysing said memory array, by addressing words within said memory array and detecting errors within said addressed words; error repairing means for selecting for a detected error either a redundant row or a redundant column to replace one of said row or column containing said error; wherein said error repairing means is configured to determine for said detected error whether said error is a single error bit in said addressed word or whether it is one of a plurality of error bits within said word, and if said error is said one of said plurality of errors, said error repair means is configured to preferentially select a redundant row rather than a redundant column to repair said error.

The above, and other objects, features and advantages will be apparent from the following detailed description of illustrative embodiments which is to be read in connection with the accompanying drawings.

BRIEF DESCRIPTION OF THE DRAWINGS

FIG. 2b shows a flow diagram illustrating steps in a method for repairing a memory using the repair circuitry of FIG. 2a;

FIG. 4b shows a flow diagram illustrating steps in a method for repairing the memory of FIG. 4a;

FIG. 6b shows a flow diagram illustrating steps in a method for repairing the memory of FIG. 6a.

DESCRIPTION OF EXAMPLE, NON-LIMITING EMBODIMENTS

Figure 1A:
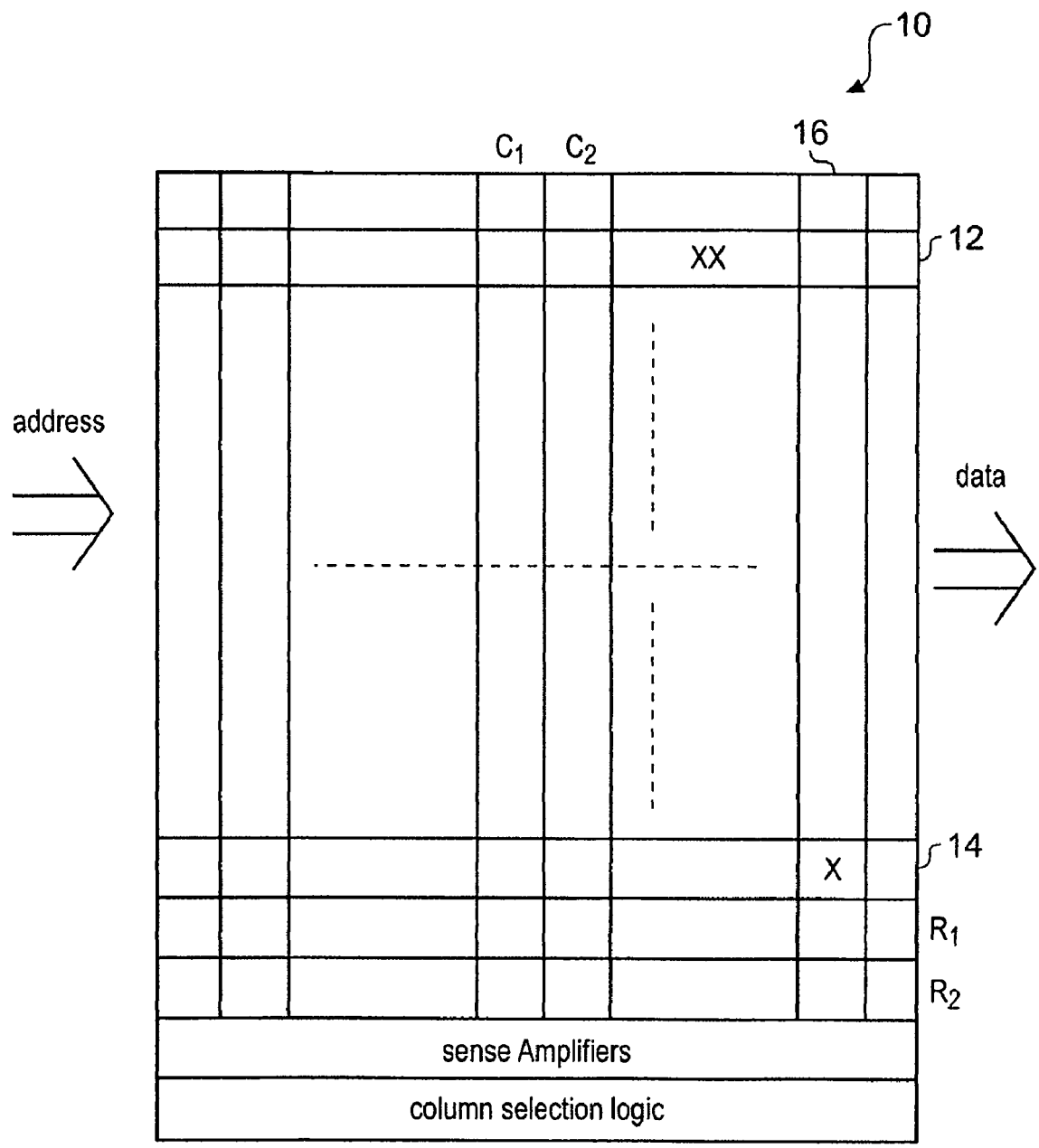
FIG. 1a shows a memory to be repaired according to an example, non-limiting embodiment.

FIG. 1a schematically shows a repairable memory array 10 having redundant columns C1 and C2 and redundant rows R1 and R2. The memory array comprises a plurality of rows and columns, a data element lying within a particular column and row. The data elements are in this embodiment addressed as words, a word lying in a row across several columns.

Figure 1B:
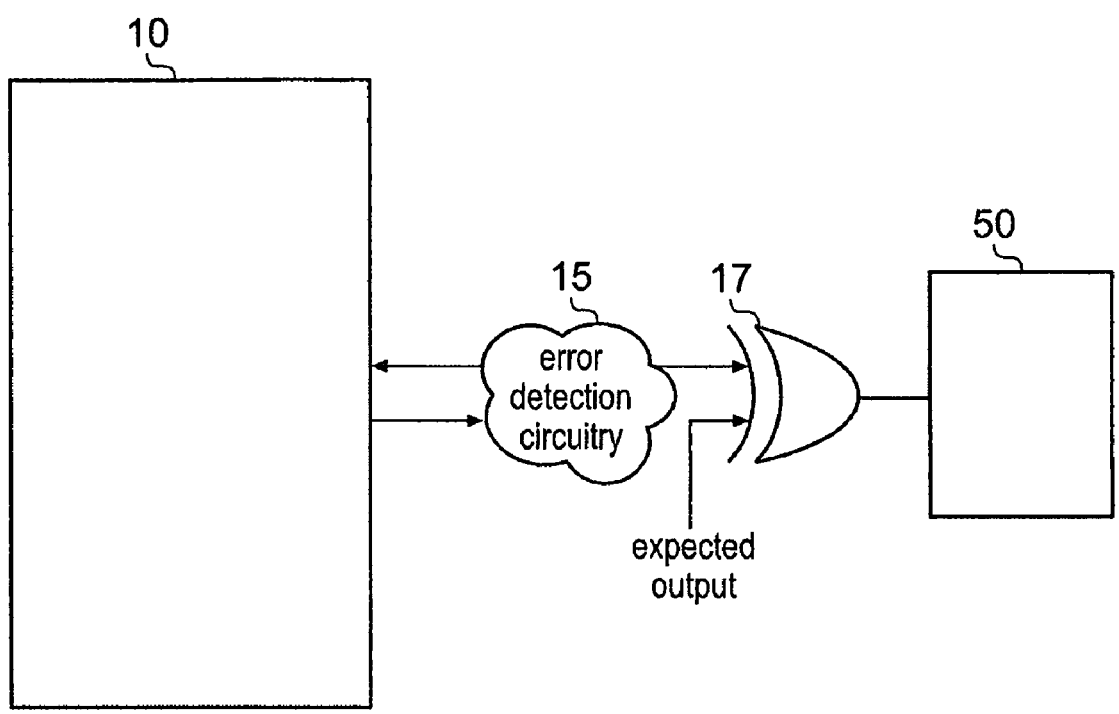
FIG. 1b shows a memory and associated test and repair circuitry according to an example, non-limiting embodiment.

FIG. 1b shows the memory array 10 and associated test and repair circuitry. There is test circuitry 15 that is associated with the array that tests the array by writing predetermined patterns of data to the memory array and reading them out and comparing them with expected values. The way that data is stored in the array determines the data patterns required to completely test the array.

There is also error repair circuitry 50 that is associated with the array and that in response to detecting errors from the test data, such as those shown in row 12, or row 14 of FIG. 1a, determines if they are a single error such as is the case for row 14 or one of multiple errors in the addressed word as is the case for row 12. In the case of multiple errors, the row, in this case row 12 is replaced with a redundant row R1, so that addressing of row 12 when the memory is in use will result in row R1 being accessed. In the case of a single error as in row 14, the column that this error lies in, in this case column 16, is replaced by redundant column C1 in future addressing of the memory.

Figure 2A:
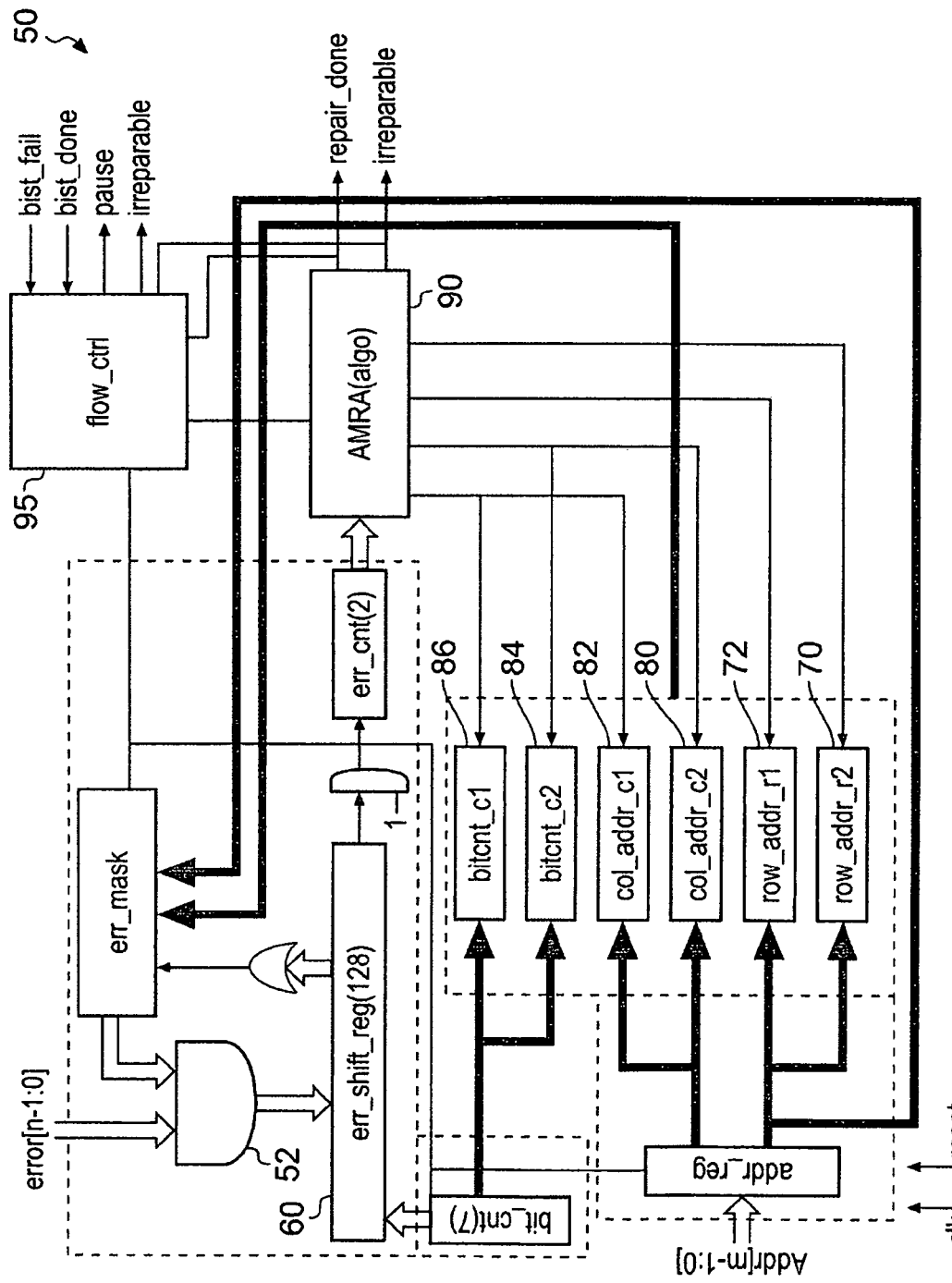
FIG. 2a shows memory repair circuitry according to an example, non-limiting embodiment.

FIG. 2a shows the error repair circuitry 50 for performing repair of memory 10 of FIG. 1 in more detail. Memory 10 is tested using a built in self test function and the output from this testing procedure is compared with the expected output from a memory without errors. An exclusive OR of the two signals is then made to generate an error bus signal error [n−1:0] that is input to this repair circuit 50. This signal is input to AND gate 52 where it is ANDed with an error mask which is data that is generated from already repaired memory locations. If the new error does not correspond to any previously repaired locations then the error is captured in the error accumulation register 60.

Analysis of how the repair can be performed is then made. First it is determined whether all redundant rows and columns have already been used. If they have then an irrepair flag is generated indicating that no further repairs can be made. If all the redundancies have not been used then an analysis is performed to determine how many bits have failed within this addressed word and where they are located. The position of the failed bits are then stored. If there is one faulty bit then the redundant columns are checked to see if one is available. If a redundant column is available the column location of the error is checked and a repair position is determined and entered into a pair of registers 80, 84 or 82, 86. That is, if C1 is the column that is to repair the error then the column address to be repaired is input into register 82 and the bit position of the error is input into register 86. Similarly if C2 is the redundant column to be used then the column address is input into register 80 and the bit position into register 84.

If there is more than one failed bit or if no redundant column is available then a check is made to see if any redundant rows are available. If a redundant row is available then the row to be repaired is inserted into the repair row registers 70 or 72 corresponding to this redundant row. This faulty row is thereby replaced with the available redundant row.

The logic analysing the error data and the availability of redundant rows and columns is logic 90. Control signals to the repair circuitry are received and output via input/output circuit 95.

Figure 2B:
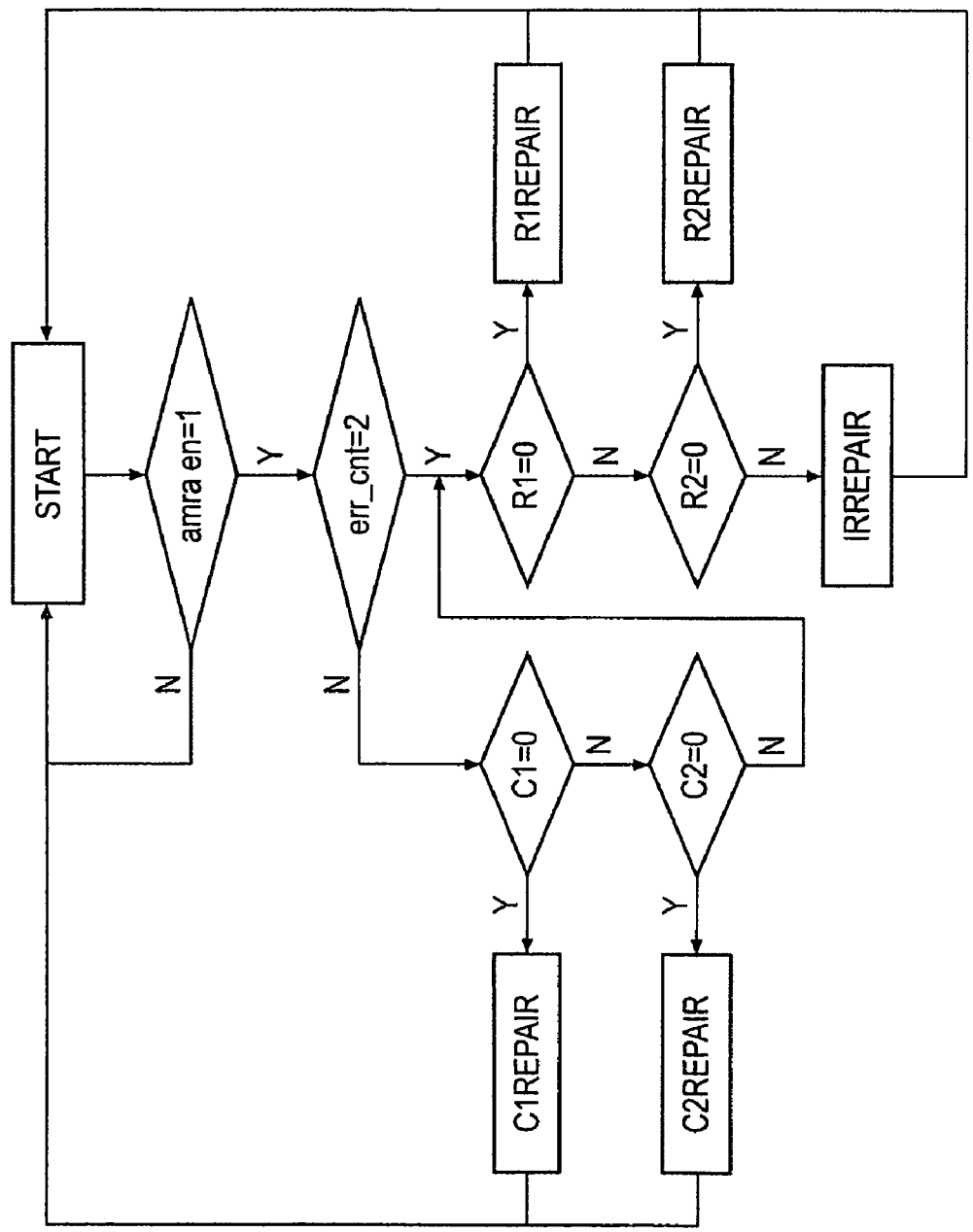

FIG. 2b shows a flow diagram illustrating schematically the steps performed during the repair of an error by the circuit of FIG. 2a. In response to detecting an error the AMRA logic 90 is enabled and this determines if the error count is 2 or more. If it is not then it is determined if redundant column C1 is available. There is a flag associated with the column that is set to 1 to indicate it is not available. Thus, if C1=0 this column is used to repair the error by replacing the faulty column with C1, the flag associated with C1 is then set to 1. If redundant column C1 is not available the flag associated with C2 is checked. If it is available then C2 is used to repair the faulty column and the flag C2 is set to 1, if not then the redundant rows are considered.

If the error count is 2 or more or if there are no available columns then the redundant rows are considered. First the flag associated with R1 is looked at. If it is 0 then R1 is used to replace the faulty row, the flag associated with R1 is set to 1 and the address of the row to be repaired is input to the row repair register for R1. If R1 is already used then R2 is checked and a similar process performed. If no redundant rows are available then an irrepair flag is generated that tells the testing circuit that it cannot repair the memory.

Figure 3:
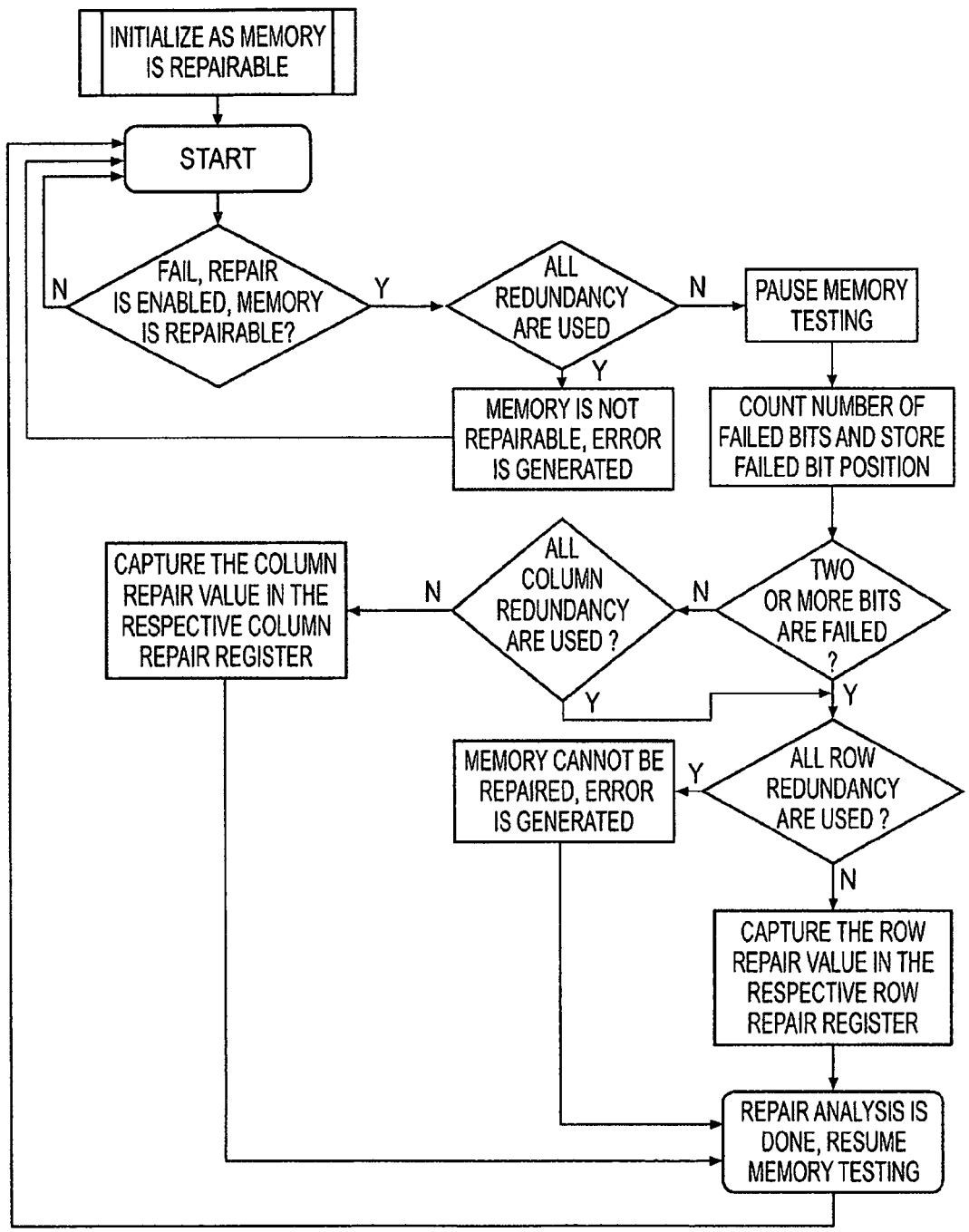
FIG. 3 shows steps performed in repairing a memory according to an example, non-limiting embodiment.

FIG. 3 shows a flow diagram illustrating steps performed to repair errors during testing of a memory. These steps are performed during testing of a memory when an error has been found and it has been determined that the error in the memory may be repairable. Initially a check is made to see if all the redundant rows and columns for the memory have already been used. If they have then the error that has been detected is not repairable and an error is generated. If they have not all been used then memory testing is paused and the number of failed bits for an address is counted and the failed bit position is stored. It is then determined whether two or more bits have failed. It should be noted that although in this embodiment the number of failed bits for an addressed word is counted, in other embodiments the number of failed bits in the whole row being addressed may be counted and the method performed in the same way. In that case the decision to preferentially use redundant rows or columns is made in dependence on the number of errors in the whole row rather than the number in the addressed word.

If only one error has been detected then it is determined if all column redundancies have been used. If they have then the method looks at row redundancies as is set out below. If they have not all been used then the column repair value is captured in the respective column repair register and this redundant column is used to repair the error. The memory testing can then be resumed.

If there are two or more errors or if there is only one but all redundant columns have been used then a check is made to see if all the row redundancies have been used. If they have not been used then the row repair value in the respective row repair register is captured and this redundant row is used to repair the faulty row. Memory testing is then resumed. If all row redundancies have been used then an indication is given that the memory cannot be repaired and an error is generated.

Figure 4A:
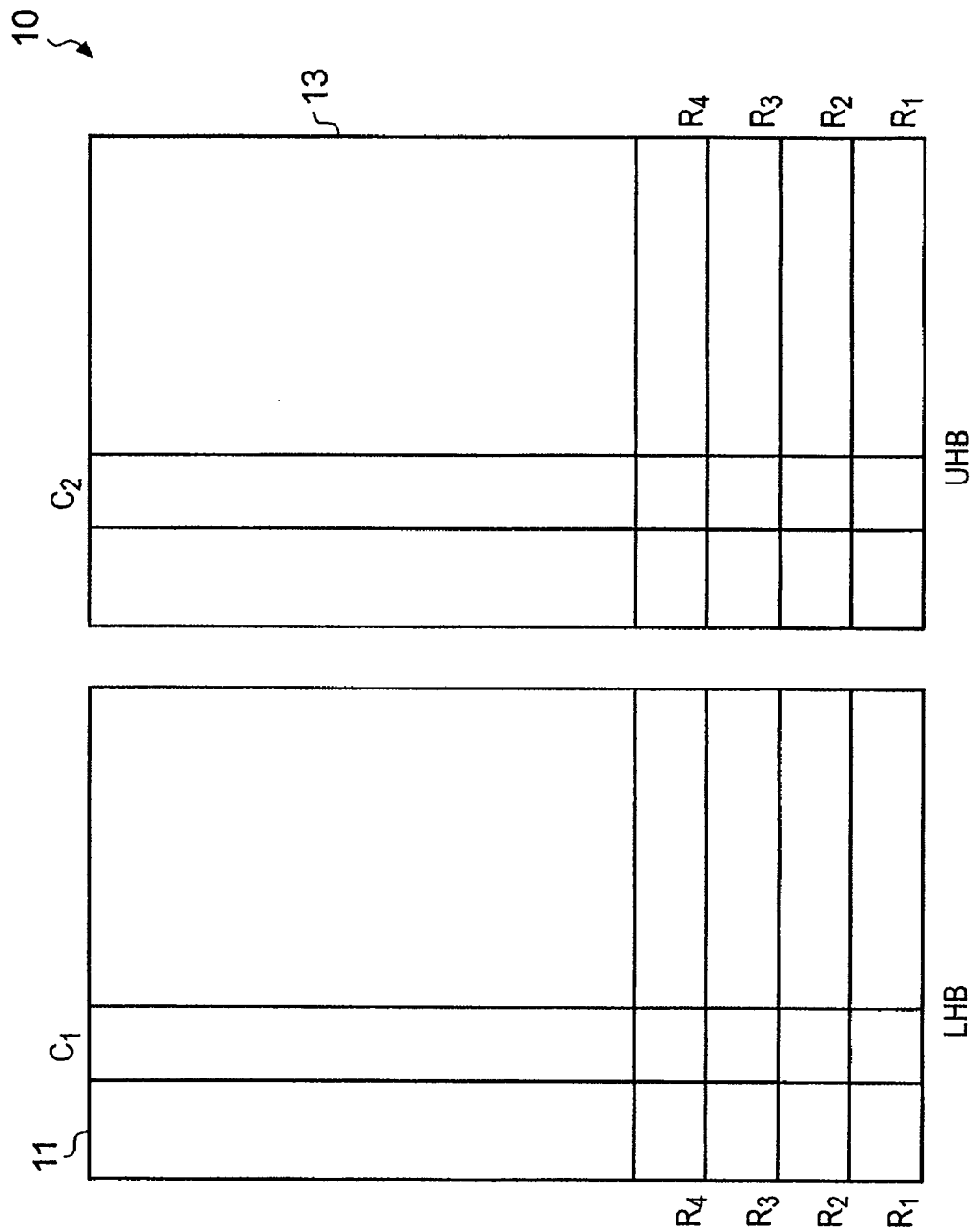
FIG. 4a shows a two bank memory to be repaired according to an example, non-limiting embodiment.

FIG. 4a shows a memory 10 having two banks, a bank 11 for the lower half bits LHB and a bank 13 for the upper half bits UHB. Each bank has a redundant column, C1 or C2 and four redundant rows R1 to R4.

Figure 4B:
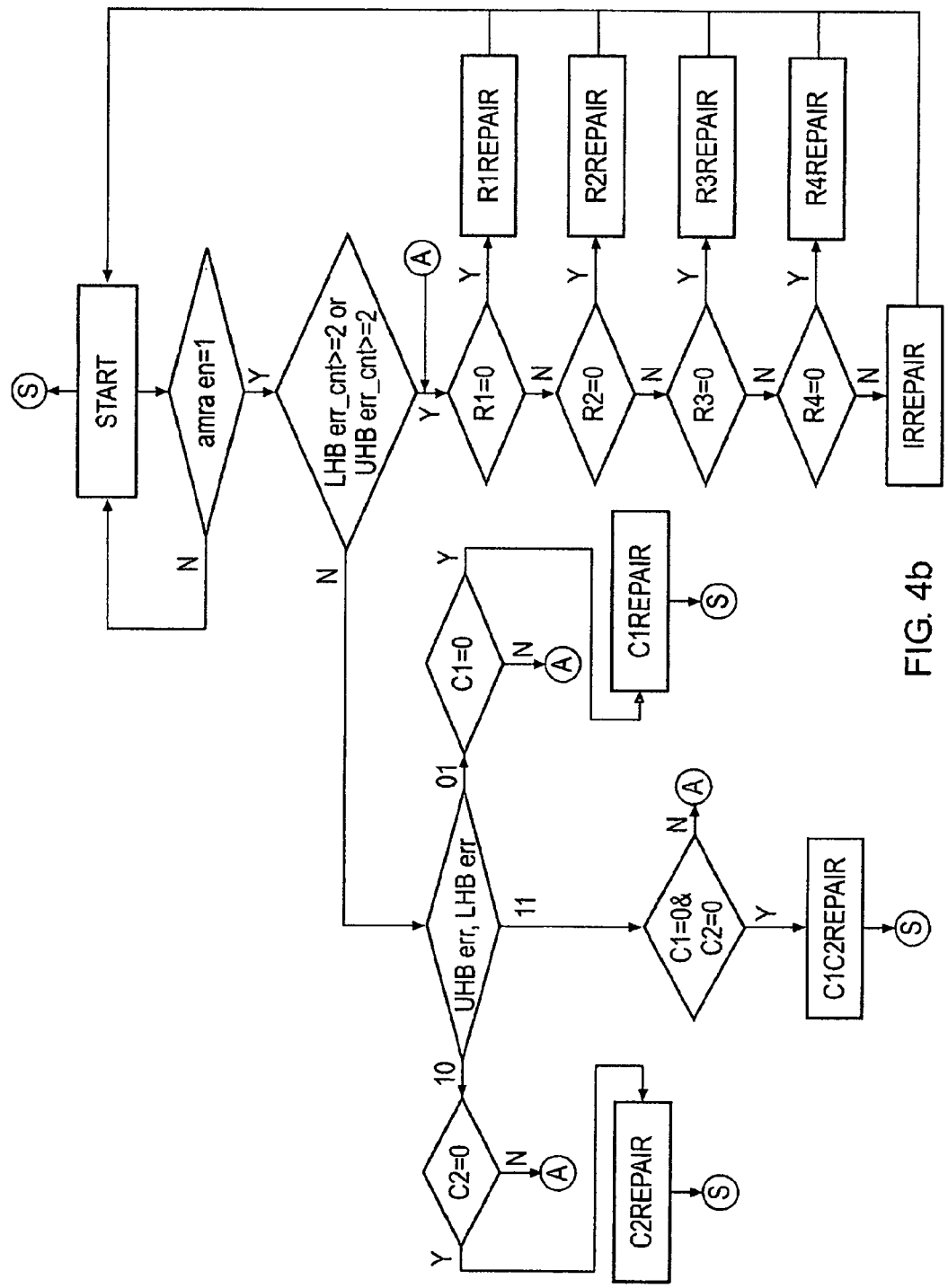

FIG. 4b shows a flow diagram of a method for repairing a memory such as that illustrated in FIG. 4a. In this embodiment, the memory being repaired is a two bank memory with the lower bits being in the left hand bank and the upper bits being in the right hand bank. In this arrangement, there are 4 redundant rows, in larger memories more redundant rows may be provided.

In this embodiment, the number of errors are counted for each bank thus, if there is more than one error in either bank 11 or 13 then row redundancy is given priority. If there is only one in either bank 11 or 13 then column redundancy is given higher priority. This is shown in FIG. 4b.

In FIG. 4b an error is detected and then it is determined if there are two or more errors in either the upper half or the lower half bits. If there are, then the redundant rows R1-R4 are analysed to see if any are available and if not then an irrepair signal is generated. If one of them is available then the address of the faulty row is written into the corresponding repair register and the flag associated with the redundant row is set to 1 to show that it is no longer available for repair.

If there are less than two errors in a single half i.e. one in either or both of the upper half or the lower half then it is determined first of all if it is the upper half or the lower half that requires correction. If it is the upper half then C2 is used for the repair provided it is available and if it is the lower half then C1 is provided for repair provided it is available. If there is an error in both then they are both used for repair provided they are both still available. If any of the required redundant columns are not available for repair then the row redundancies are looked at to see if a redundant row can be used to repair the error.

Figure 5:
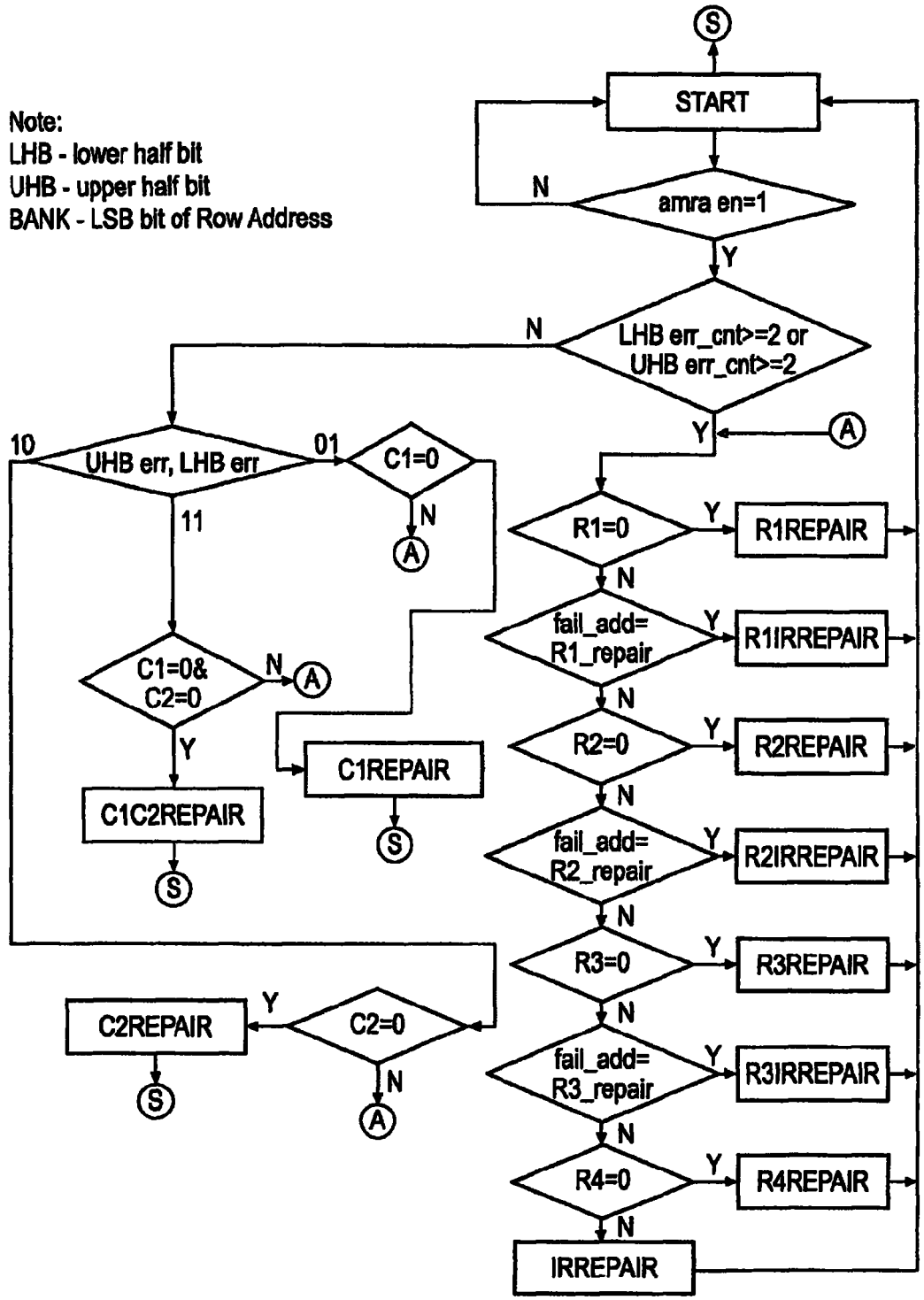
FIG. 5 shows a flow diagram illustrating steps in a method for repairing a memory where the redundant rows may themselves be faulty.

FIG. 5 shows a similar embodiment which additionally shows what occurs if following replacement of a faulty row with a redundant row, the memory test procedure detects an error in the redundant replacement row. In such a case the repair register for the faulty redundant row is set to indicate irrepair, and the address of the row to be replaced is then input to a further available redundant row. Thus, if a faulty row was replaced by redundant row R1 and this was later seen to be faulty, it would be marked as such using an irrepair value stored in the repair register for R1, and the location of the original faulty row would be input to the repair register for R2, such that row R2 would replace this row.

Figure 6A:
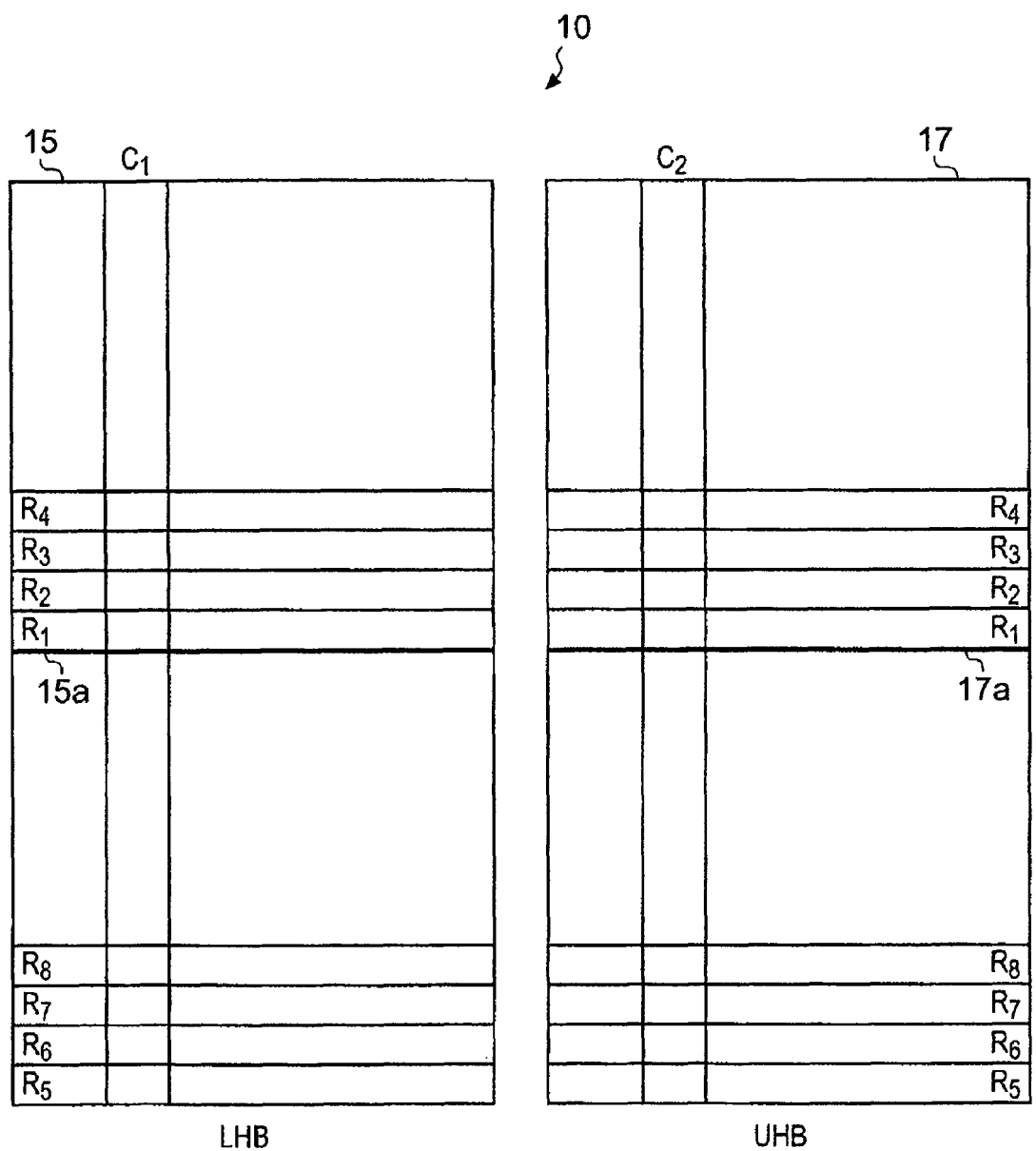
FIG. 6a shows a two bank memory with two sections to be repaired according to an example, non-limiting embodiment.

FIG. 6a shows a memory 10 divided into two banks 15 and 17 for storing lower half and upper half bits respectively. The two banks are each themselves divided into two sections or banks at lines 15a and 17a respectively, one half having redundant rows R1 to R4 and the other half having redundant rows R5 to R8.

Figure 6B:
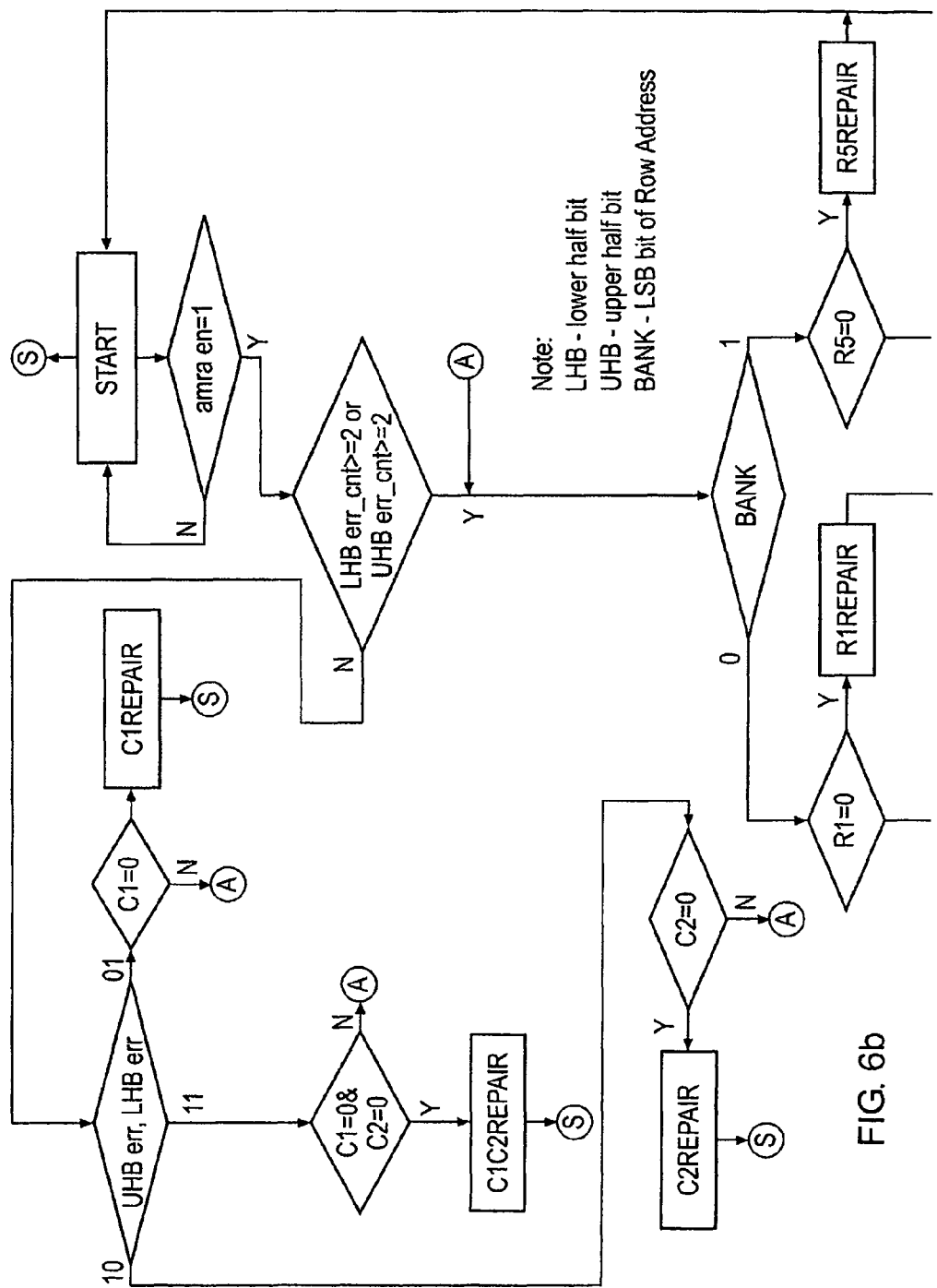
Figure 6B:
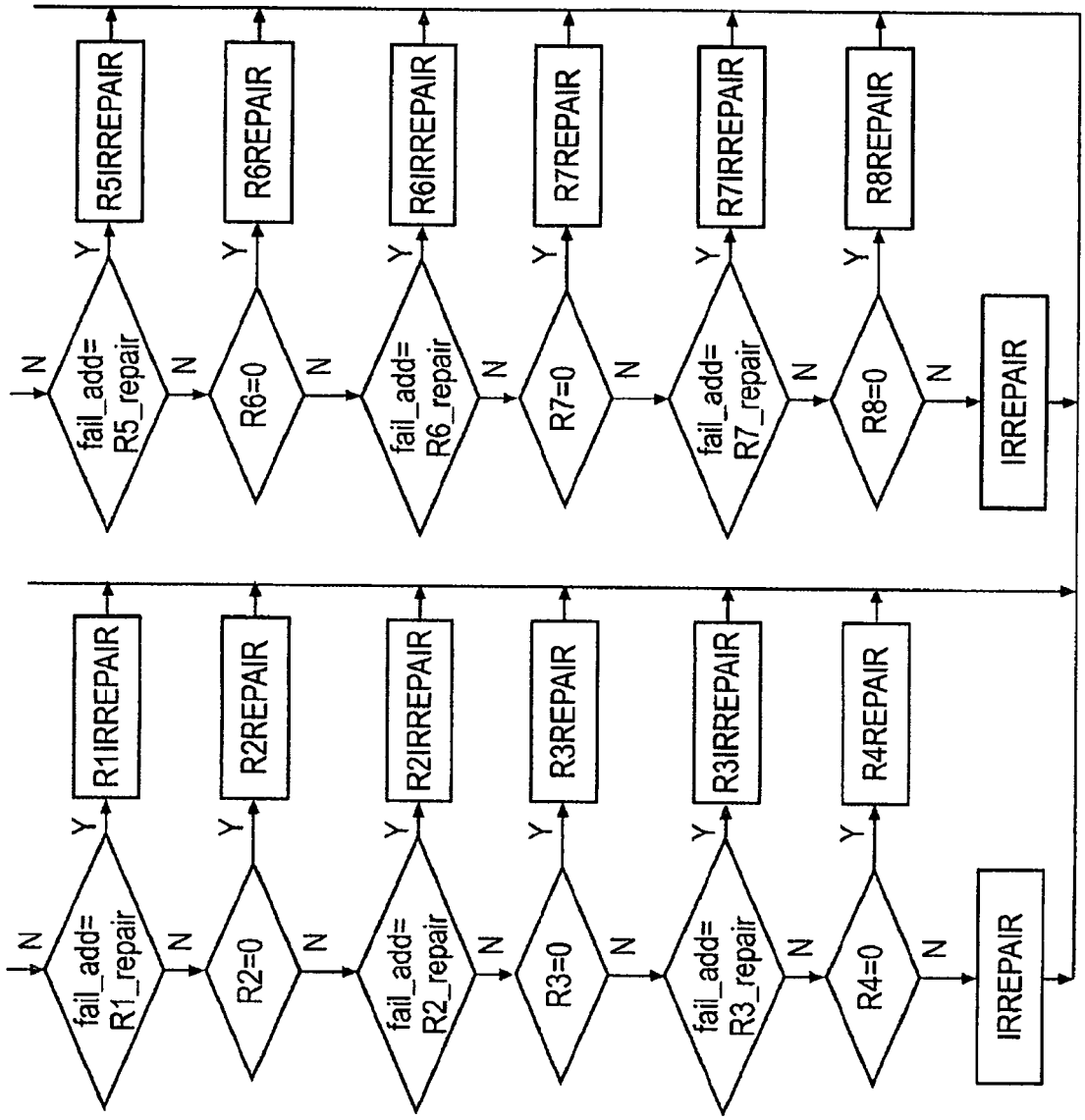

FIG. 6b shows a flow diagram of a method for repairing the memory of FIG. 6a. This is very similar to the flow diagram of FIG. 4b, only in this case when a row repair is to be done, it is first determined if it is a row in the top half of the bank or the lower half. Depending where it is located either one of rows R1 to R4 or one of rows R5 to R8 are used if available. This dividing of the memory into different portions or banks is done where the memory is large and although in this embodiment it is shown as being divided into two portions or banks, it should be clear that it could be divided into more portions.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims.

We claim:

1. A memory circuit comprising a memory array comprising a plurality of rows and a plurality of columns, each row comprising at least one addressable word, said memory array comprising at least one redundant row and at least one redundant column;
    error detection circuitry configured to analyze said memory array, by accessing words within said memory array and detecting errors within said accessed words; and
    error repair circuitry configured to select for a detected error either a redundant row or a redundant column to replace one of said rows or columns containing said detected error; wherein
    said error repair circuitry is configured to determine for said detected error whether said detected error is a single error bit in said accessed word or whether it is one of a plurality of error bits within said accessed word, and if said detected error is said one of said plurality of error bits, said error repair circuitry is configured to preferentially select a redundant row rather than a redundant column to repair said detected error; and
    in response to detecting that said detected error is a single error bit in said accessed word said error repair circuitry is configured to preferentially select a redundant column rather than a redundant row to repair said detected error without detecting whether there are other errors in the same column as said detected error.

2. A memory circuit according to claim 1, wherein each row comprises a plurality of addressable words; and
    said error repair circuitry is configured to group together at least some accessed words from a same row and to determine for an error detected within said same row whether said detected error comprises a single error within said grouped words or whether it comprises one of a plurality of errors within said grouped words, said error repair circuitry being configured to preferentially select a redundant row rather than a redundant column to repair said error if said error is one of said plurality of errors, and if said detected error is said single error said error repair circuitry is configured to preferentially select a redundant column to repair said detected error.

3. A memory circuit according to claim 2, wherein said error repair circuitry is configured to group together all words from a same row.

4. A memory circuit according to claim 1, wherein
    said error repair circuitry is responsive to detecting no available redundant row or column corresponding to said preferential selection, to select an alternative available redundant column or row instead of said preferential selection to repair said detected error, and in response to detecting no available redundant rows or columns to issue a repair failed signal.

5. A memory circuit according to claim 1, wherein said error detection circuitry is configured to analyse said memory by accessing said accessed words within said memory array in at least one predetermined order.

6. A memory circuit according to claim 1, wherein said memory array comprises a plurality of redundant rows and columns.

7. A method of repairing a memory array comprising a plurality of rows and a plurality of columns, each row comprising at least one addressable word, said memory array comprising at least one redundant row and at least one redundant column comprising the steps of:
    analysing said memory array, by accessing words within said memory array and detecting errors within said accessed words;
    selecting for a detected error either a redundant row or a redundant column to replace one of said rows or one of said columns containing said detected error; wherein
    said step of selecting a redundant row or column comprises determining for said detected error whether said detected error is a single error in said accessed word or whether it is one of a plurality of errors within said accessed word, and if said detected error is said one of said plurality of errors preferentially selecting a redundant row rather than a redundant column to repair said detected error,
    wherein if said detected error is a single error in said accessed word, said selecting step preferentially selects a redundant column rather than a redundant row to repair said detected error without detecting whether there are other errors in the same column as said detected error.

8. A method according to claim 7, wherein each row within said memory array comprises a plurality of addressable words; and
    said step of selecting a redundant row or column comprises grouping together at least some accessed words from a same row and determining for an error detected within said same row whether said detected error comprises a single error within said grouped words or whether it comprises one of a plurality of errors within said grouped words, and preferentially selecting a redundant row rather than a redundant column to repair said detected error if said detected error is one of said plurality of errors, and if said detected error is said single error preferentially selecting a redundant column to repair said detected error.

9. A method according to claim 8, wherein said step of selecting a redundant row or column groups together all words from a same row.

10. A method according to claim 7, comprising a further step of:
    determining if said preferentially selected redundant row or column is available and if not selecting an alternative redundant column or row to repair said detected error if one is available, and in response to detecting no available redundant rows or columns issuing a repair failed signal.

11. A method according to claim 7, wherein said initial step comprises:
    analysing said memory array, by accessing words within said memory array in a predetermined order and detecting errors within said accessed words.

12. A means for storing data comprising a plurality of rows and a plurality of columns, each row comprising at least one addressable word, said means for storing data comprising at least one redundant row and at least one redundant column;
    error detecting means for analysing said means for storing data, by accessing words within said means for storing data and detecting errors within said accessed words;

error repairing means for selecting for a detected error either a redundant row or a redundant column to replace one of said rows or one of said columns containing said detected error; wherein said error repairing means is configured to determine for said detected error whether said detected error is a single error bit in said accessed word or whether it is one of a plurality of error bits within said accessed word, and if said detected error is said one of said plurality of error bits, said error repairing means is configured to preferentially select a redundant row rather than a redundant column to repair said detected error; and in response to detecting that said detected error is a single error bit in said accessed word, said error repairing means is configured to preferentially select a redundant column rather than a redundant row to repair said detected error without detecting whether there are other errors in the same column as said detected error.

* * * * *